(12) United States Patent
Ni et al.

(10) Patent No.: US 10,624,227 B1
(45) Date of Patent: Apr. 14, 2020

(54) COMPUTER CHASSIS WITH RAIL BRACKETS

(71) Applicant: QUANTA COMPUTER INC., Taoyuan (TW)

(72) Inventors: Hsiao-Tsu Ni, Taoyuan (TW); Yaw-Tzorng Tsorng, Taoyuan (TW); Chun Chang, Taoyuan (TW); Tung-Hsien Wu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/291,913

(22) Filed: Mar. 4, 2019

(51) Int. Cl.
*H05K 5/00* (2006.01)
*H05K 7/14* (2006.01)
*G06F 1/18* (2006.01)

(52) U.S. Cl.
CPC ........... *H05K 7/1489* (2013.01); *G06F 1/181* (2013.01)

(58) Field of Classification Search
CPC .................................................. H05K 5/00
See application file for complete search history.

(56) References Cited

U.S. PATENT DOCUMENTS

| | | |
|---|---|---|
| 2008/0043451 A1 | 2/2008 | Sato et al. |
| 2013/0141887 A1 | 6/2013 | Wang et al. |
| 2015/0331459 A1* | 11/2015 | Ross ............... G11B 33/128 |
| | | 361/679.32 |
| 2019/0059172 A1 | 2/2019 | Gupta et al. |

OTHER PUBLICATIONS

Extended European Search Report for EP Application No. 19185892.7, dated Jan. 23, 2020.

* cited by examiner

*Primary Examiner* — Jerry Wu

(74) *Attorney, Agent, or Firm* — Nixon Peabody LLP; Zhou Lu

(57) ABSTRACT

The present disclosure provides a chassis assembly which can include a chassis body, at least one sled, and at least one rear bracket. The chassis body can have at least one pair of rail brackets along opposing sides of the chassis body. The at least one sled can hold computer components and be sized according to the computer components. The at least one rear bracket can couple with the at least one sled.

12 Claims, 5 Drawing Sheets

COMPUTER CHASSIS WITH RAIL BRACKETS

FIELD

The present disclosure relates to a computer chassis configured to hold sleds of different sizes.

BACKGROUND

Computer chassis can be used in rack systems to hold a variety of computer components and of many different sizes. For example, a single computer chassis can hold multiple sleds, where each sled is sized to hold specific computer components. Conventional computer chassis can hold, for example, a 1U sled, a 2U sled, and/or a 3U sled.

In order to hold sleds of different sizes within one computer chassis, conventional chassis need to be permanently configured with partitions according to the sled size. Partitions provide the structural support for a computer chassis to hold more than one sled. For example, one computer chassis can be configured with three separate, permanent partitions to support three 1U sleds. In another example, one computer chassis can be configured with two separate, permanent partitions to support one 1U sled and one 2U sled. In a third example, one computer chassis can be configured without any partitions to support one 3U sled. The configuration of permanent partitions in a computer chassis prevent the same computer chassis from holding sleds of a first size and then sleds of a second size.

For example, a 2U sled is about twice as large as a 1U sled, and a 3U sled is about three times as large as a 1U sled. Therefore, a computer chassis which is configured to hold three 1U sleds can never receive either a 2U sled or a 3U sled. In a similar problem, a computer chassis which is configured to hold a single 3U sled can never hold three 1U sleds, because such a computer chassis does not have partitions to support the separation for each of the three 1U sleds.

These chassis designs force users to maintain a large variety of chassis bodies, configured to support every combination of sled sizes. If a single sled needs to be switched out with another sled of a different size, the entire computer chassis needs to be replaced. This results in high costs because all possible chassis sizes must be supported. This also results in additional burdens because any size change in the installed equipment necessitates replacing the entire computer chassis.

Therefore, what is needed is a computer chassis design that does not require switching out the entire chassis when replacing a first sled with a second sled of a different size.

SUMMARY

The various examples of the present disclosure are directed towards a computer chassis. In a first embodiment of the present disclosure, the computer chassis can be a chassis body with at least one pair of rail brackets. A first rail bracket in a pair can be located on a first side of the chassis body, and a second rail bracket can be located on a second side of the chassis body, where the second side and the first side are opposing sides of the chassis body. The first and second rail brackets can be at a set height from a bottom surface of the chassis body.

In some examples, the chassis body can include at least two partitions. The pairs of rail brackets can be positioned along the sides of each partition.

In some examples, the computer chassis can also include at least one sled. The sled can hold at least one computer component. A size of the sled can correspond to the size of the at least one computer component.

In some examples, each sled can also include at least one rear bracket. An exemplary rear bracket can couple with a sled. End portions of the rear bracket can have a lower height than the distance between a chassis base and the at least one pair of rail brackets ("rail bracket set height"). A middle portion of the rear bracket can have a height larger than the rail bracket set height.

In some examples, a first sled of the at least one sled can have a different size than a second sled of the at least one sled. In some examples, the at least one sled can be a 1U sled, a 2U sled, or a 3U sled. In some examples, each of the sleds can move into and out of the chassis body independent of any remaining sleds in the chassis body.

A second embodiment of the present disclosure can provide for a chassis assembly. The chassis assembly can include a chassis body, at least one sled, and at least one rear bracket. The chassis body can include at least one pair of rail brackets. A first rail bracket in a pair can be on a first side of the chassis body, and a second bracket in the pair can be on a second side of the chassis body. The first side and the second side can be opposing sides of the chassis body. The at least one sled can hold at least one computer component. The sled can have a size corresponding to the at least one computer component in the sled. Additional examples of the second embodiment can be as described above with respect to the first embodiment.

A third embodiment of the present disclosure can provide for a rack system housing a plurality of computer chassis. The rack system can include a plurality of chassis bodies, a plurality of sleds, and a plurality of rear brackets. Each chassis body can include at least one pair of rail brackets. A first bracket in the at least one pair can be on a first side of each chassis body, and a second bracket in the pair can be on a second side of the chassis body. The first side and the second side can be opposing sides of the chassis body. Each chassis body can be configured to receive at least one sled. Each of the plurality of sleds can hold at least one computer component. Each sled can be sized according to the size of the at least one computer component held by the sled. Each of the plurality of rear brackets can be configured to couple with one of the plurality of sleds. Additional examples of the third embodiment can be as described above with respect to the first embodiment.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1:
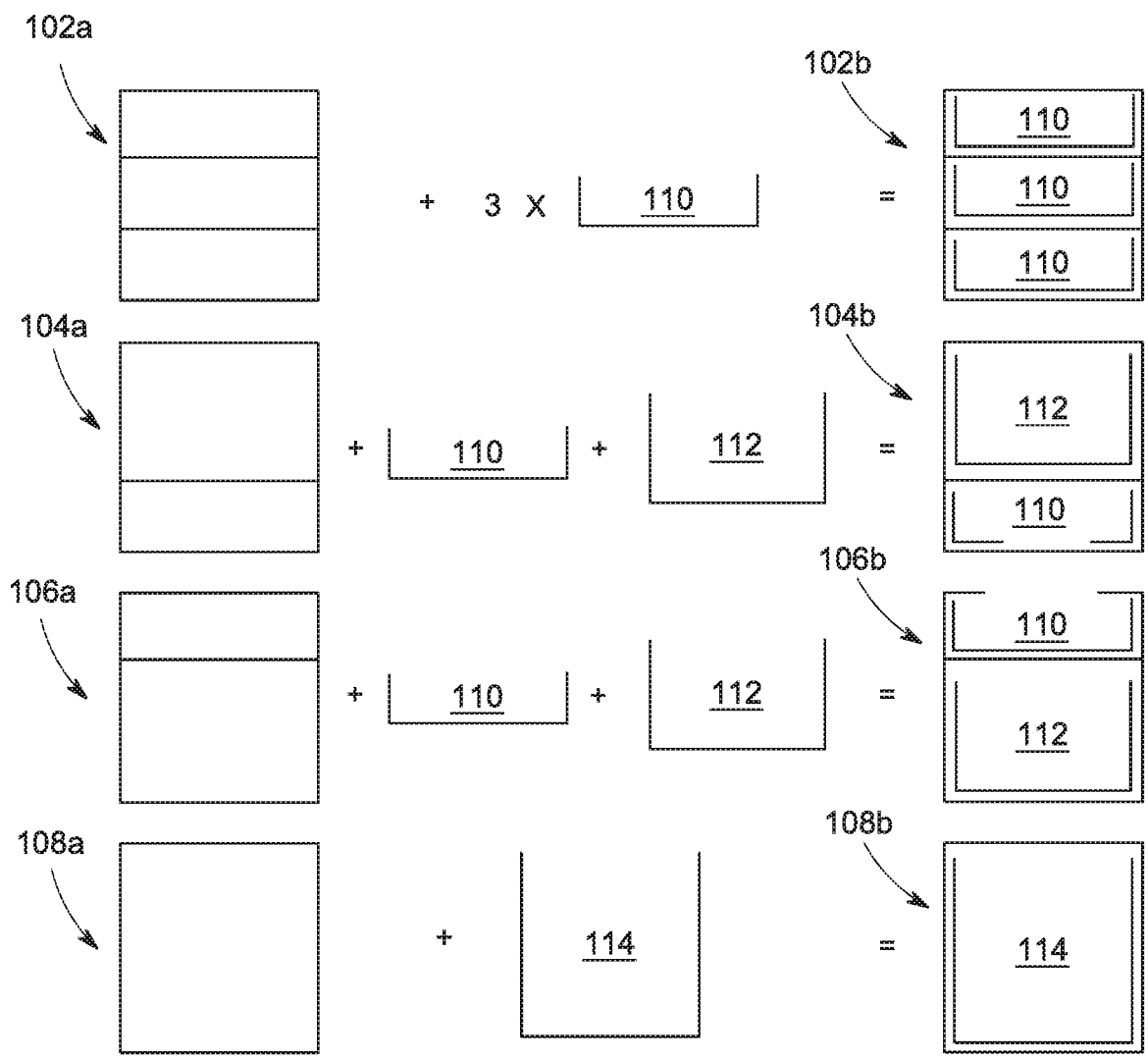
FIG. 1 shows conventional designs of computer chassis, according to the prior art.

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure is directed to a computer chassis with rail brackets along the side that allow sleds to slide into and out of the computer chassis. The design additionally allows sleds of any size to be used in the exemplary chassis. This feature is provided for because the chassis does not have permanent partitions that allow for only heights of certain sleds. Therefore, an exemplary chassis, according to an embodiment of the present disclosure, can provide for a variety of sled configurations, where the sleds can have different sizes.

FIG. 1 shows conventional designs of computer chassis, according to the prior art. FIG. 1 shows chassis in a first design 102 (unloaded 102a and loaded 102b), a second design 104 (unloaded 104a and loaded 104b), a third design 106 (unloaded 106a and loaded 106b), and a fourth design 108 (unloaded 108a and loaded 108b). FIG. 1 also shows a first size sled 110, a second size sled 112, and a third size sled 114.

The first design 102 provides a three-partition chassis configured to receive three sleds of a first size 110. The second design 104 provides a two-partition chassis configured to receive a second size sled 112 above a first size sled 110. The third design 106 provides a two-partition chassis configured to receive a second size sled 112 below a first size sled 110. The fourth design 108 provides a single-partition chassis configured to receive a third size sled 114.

As shown by both the loaded positions 102b, 104b, 106b, and 108b and the unloaded positions 102a, 104a, 106a, and 108a, the computer chassis 102, 104, 106, and 108 can only receive sleds 110, 112, and 114 according to their predetermined sizes. For example, second size sled 112 and third size sled 114 cannot fit into chassis 102 because they are too large for the three partitions. In another example, chassis 108 can only receive one sled 110, 112, or 114, regardless of the sled size, because there is no other support in the chassis 108 to receive another sled 110, 112, or 114.

Therefore, conventional chassis designs do not allow flexible sled management because of the rigidity of their predetermined designs. If a user has a chassis 102 and wishes to replace two of the three first size sleds 110 with a second size sled 112, the user must remove all first size sleds 110, replace the chassis 102 with a chassis 104, and replace the chosen sleds.

Figure 2:
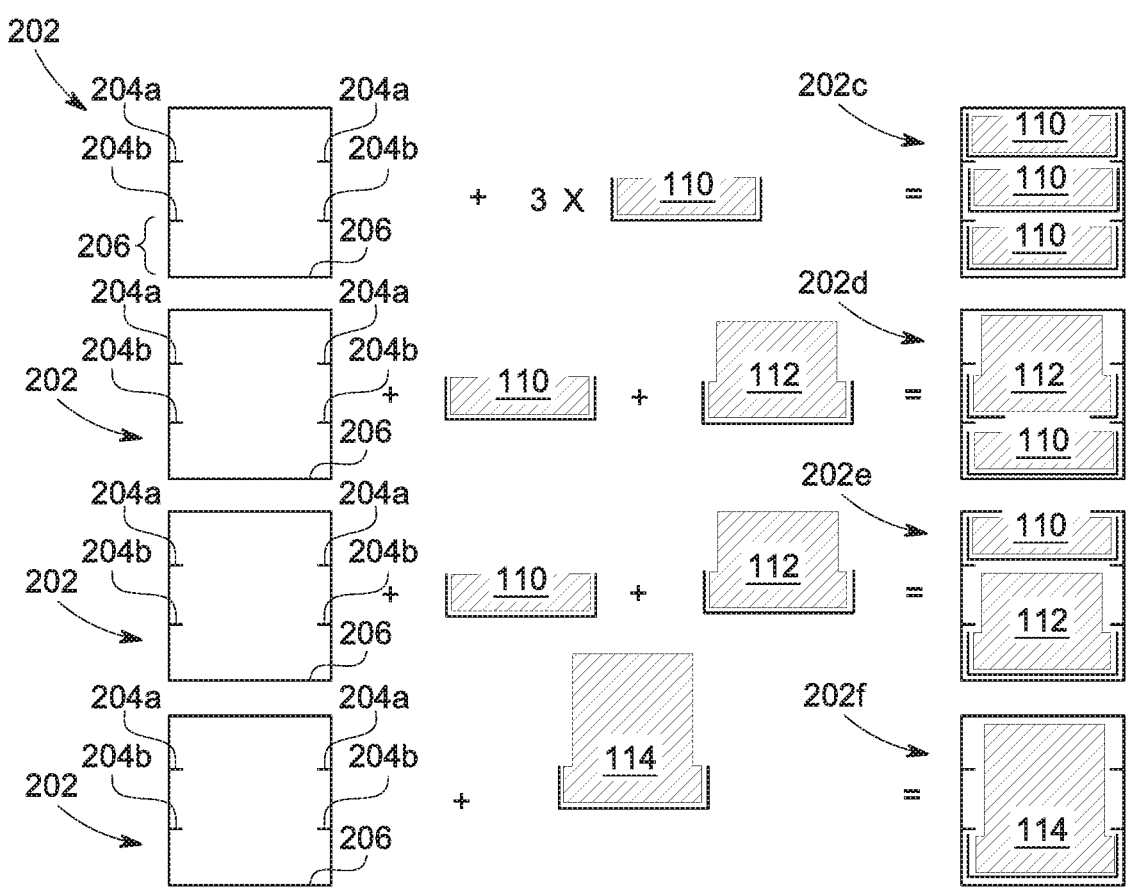
FIG. 2 shows an exemplary design of a computer chassis with various sled configurations, according to an embodiment of the present disclosure.

In response to the limitations of conventional chassis designs, the present disclosure provides a chassis design with rail brackets which provide for a single chassis design that can receive a variety of sled configurations. FIG. 2 shows an exemplary chassis 202 which can support a variety of loaded configurations (202c, 202d, 202e, and 202f) for sleds 110, 112, and 114.

Chassis 202 includes pairs of rail brackets 204. Although each chassis 202 is shown to have two pairs of rail brackets 204, the present disclosure contemplates that any number of pairs can be provided for in an exemplary chassis 202, so long as there is at least one pair 204. Each pair 204 can be at an equal height 206 from the bottom of the chassis. In some examples where there are more than one pair of rail brackets 204 in a computer chassis, each pair 204 can be at a set height 206 (as seen in FIG. 2). In other examples (not shown), the height 206 can be variable for each pair 204. For example, the set height 206 can be a height of the first size sled 110. Each rail bracket 204 can extend along a width of the chassis 202 (as pictured in FIG. 3). Therefore, the pairs of rail brackets 204 can allow chassis 202 to receive any sled 110, 112, or 114.

In a first loaded configuration 202c, chassis 202 can hold three first size sleds 110, where two first size sleds 110 rests on top of rail brackets pairs 204a and 204b and a third first size sled 110 rests on top of a bottom surface 206 of chassis 202. In a second loaded configuration 202d, chassis 202 can hold a second size sled 112 on top of a second pair of rail brackets 204b which a first size sled 110 rests on bottom surface 206. In a third loaded configuration 202e, chassis 202 can hold a second size sled 112 resting on bottom surface 206 and a first size sled 110 resting on a first pair of rail brackets 204a. In a fourth loaded configuration 202f, chassis 202 can hold a third size sled 114 resting on bottom surface 206.

Chassis 202 can provide for a variety of loaded configurations 202c, 202d, 202e, and 202f, according to the needs of a system. Chassis 202 allows individual sleds 110, 112, and 114 to be replaced without having to replace the chassis 202. For example, chassis 202 can easily transition between configuration 202c to configuration 202d by removing first size sleds 110 resting on rail brackets 204a and 204b and installing second size sled 112 on rail brackets 204b. This chassis 202 provides substantial benefits over conventional designs that otherwise do not allow for easy replacement of sleds.

In some examples of the present disclosure, first size sleds 110 can be 1U sleds, second size sleds 112 can be 2U sleds, and third size sleds 114 can be 3U sleds. Although 1U sleds, 2U sleds, and 3U sleds are specifically identified, the present disclosure contemplates that any sleds can be used.

Figure 3:
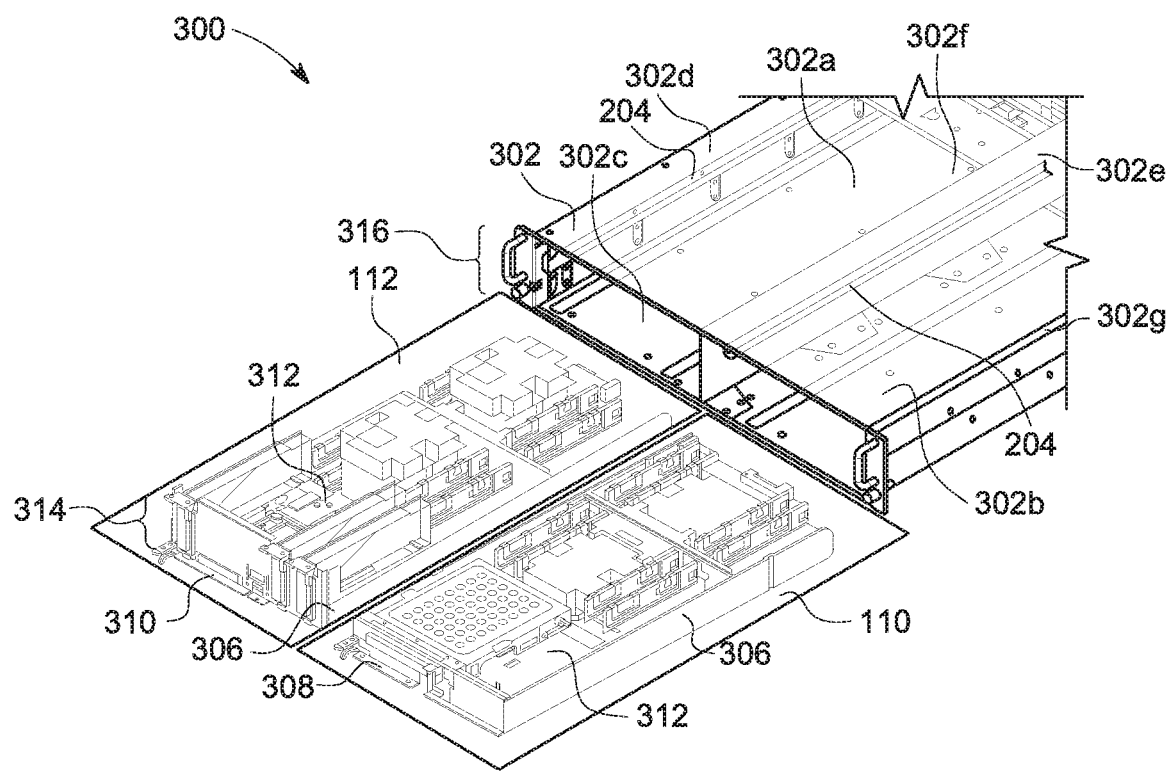
FIG. 3 shows an exemplary set of sleds loading into a chassis, according to an embodiment of the present disclosure.

FIG. 3 shows an exemplary system 300, according to an embodiment of the present disclosure. System 300 can include many components and similar labels to FIGS. 1 and 2. In addition, system 300 can include chassis 302, tray bases 306, a first rear bracket 308, a second rear bracket 310, and main boards 312.

System 300 can include a chassis 302 with two partitions 302a and 302b, where each partition 302a and 302b can receive a sled 110 or 112. Each partition 302a and 302b can have a single pair of rail brackets 204 extending along a length of the partition 302a and 302b. Although a single rail bracket 204 of each pair is shown (e.g., on sides 302d and 302e), each rail bracket can have a corresponding member on an opposing side (e.g., sides 302f and 302g, respectively) of partitions 302a and 302b. Although system 300 only shows a single pair of rail brackets 204 for each partition 302a and 302b, partitions 302a and 302b can have any number of pairs of rail brackets 204 (e.g., as discussed above with respect to FIG. 2). Although system 300 only shows two partitions 302a and 302b, chassis 302 can have any number of partitions.

System 300 can additionally provide for sleds 110 and 112, where each sled has a tray base 306 and a main board 312. Tray base 306 provides structural support to the main boards 312 and any computer components hosted on the main boards 312. The main boards 312 can mount any computer components that are greater than a 1U sled size. System 300 can further include a first rear bracket 308 for first size sled 110 and a second rear bracket 310 for second size sled 112. Rear brackets 308 and 310 can support additional plugged in components, provide electro-magnetic interference shielding, and prevent a user from directly contacting a printed circuit board. In some examples of the present disclosure, the rear brackets 308 and 310 are directly attached to the tray base 306, and, in other instances, the rear brackets 308 and 310 can be attached to computer components hosted on the main board 312.

For example, chassis 302 can receive a second size sled 112 into first partition 302a and a first size sled 110 into second partition 302b. The first size sled 110 can rest on bottom surface 302c of chassis 302 or along a pair of rails 204. The second size sled 112 can have a similar height 314 to a height 316 of chassis 302. FIG. 3 demonstrates that either sled 110 and 112 can fit into either partition 302a and 302b because the partitions have the same design and can receive a sled of either size. Therefore, system 300 presents advantages over conventional chassis designs which do not allow for flexible management of which sleds go into which parts of the chassis.

Figure 4A:
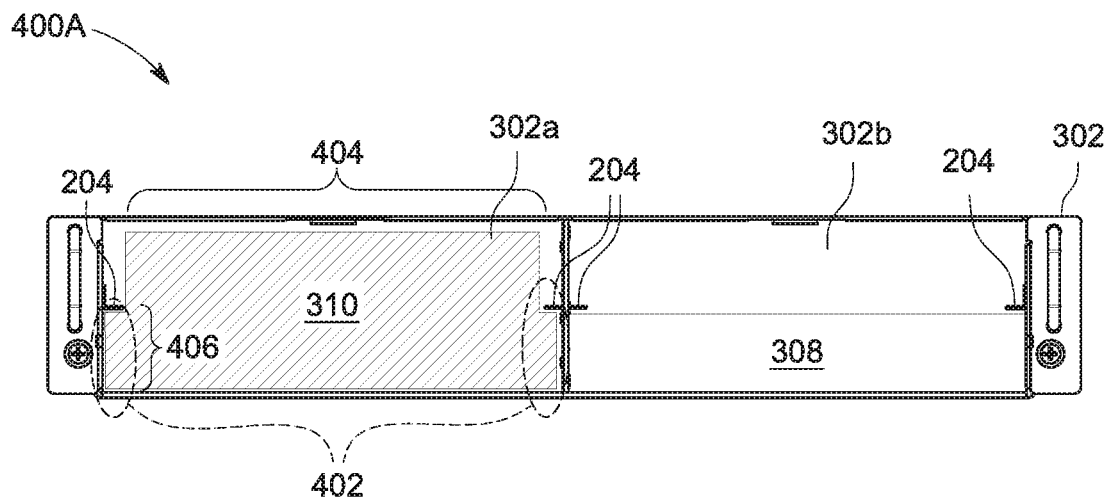
FIG. 4A shows a front side perspective view of an exemplary partitioned computer chassis, according to an embodiment of the present disclosure.

FIG. 4A shows a front perspective view of an exemplary system 400A, according to an embodiment of the present disclosure. System 400A can include many components and similar labels to components in FIGS. 1-3. Additionally, system 400A shows end portions 402 and a middle portion 404 of rear bracket 310. End portions 402 can have a lower height than a set height 406 of rail brackets 204, while middle portion 404 can have a height larger than set height 406. This lower height of the end portions 402 can allow rear bracket 310 to slide into chassis 302, while the rear bracket 310 still protects the sled and any computer components on the sled (not shown).

Therefore, chassis 302 can receive sleds of a first size 110 and a second size 112. The present disclosure contemplates that chassis 302 can receive sleds of any size, so long as a height of the sled is not larger than a height of the chassis 302.

Figure 4B:
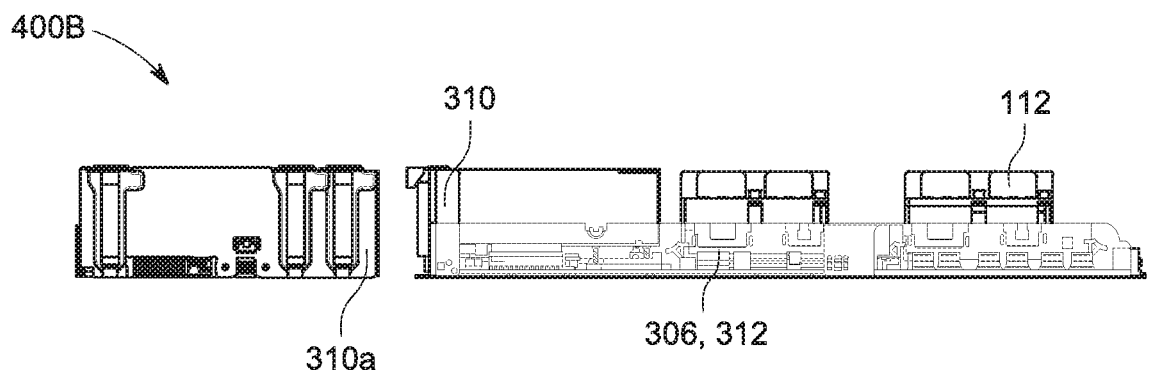
FIG. 4B shows a side perspective view of an exemplary 2U sled and rear bracket.
Figure 4C:
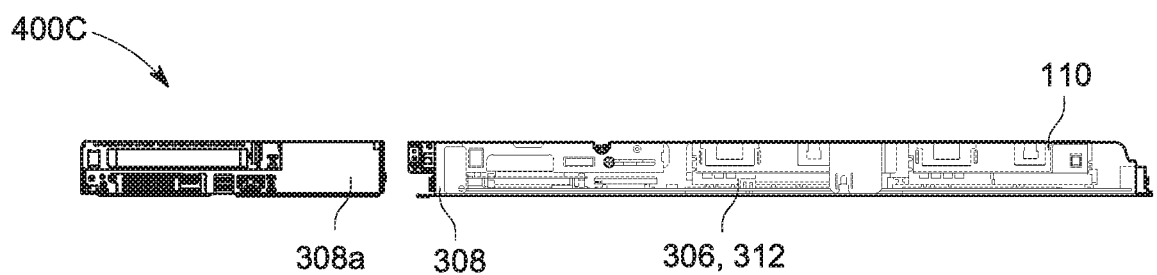
FIG. 4C shows a side perspective view of an exemplary 1U sled and rear bracket, according to embodiments of the present disclosure.

FIG. 4B shows a side perspective view of an exemplary 2U sled and rear bracket 400B, and FIG. 4C shows a side perspective view of an exemplary 1U sled and rear bracket 400C, according to embodiments of the present disclosure. FIGS. 4B and 4C can include many components and similar labels to components in FIGS. 1-3. Additionally, FIGS. 4B and 4C show front perspectives 308a and 310a of rear brackets 308 and 310. FIGS. 4B-4C demonstrate that the same tray base 306 and main board 312 can be used for each sled 110 and 112.

Figure 5A:
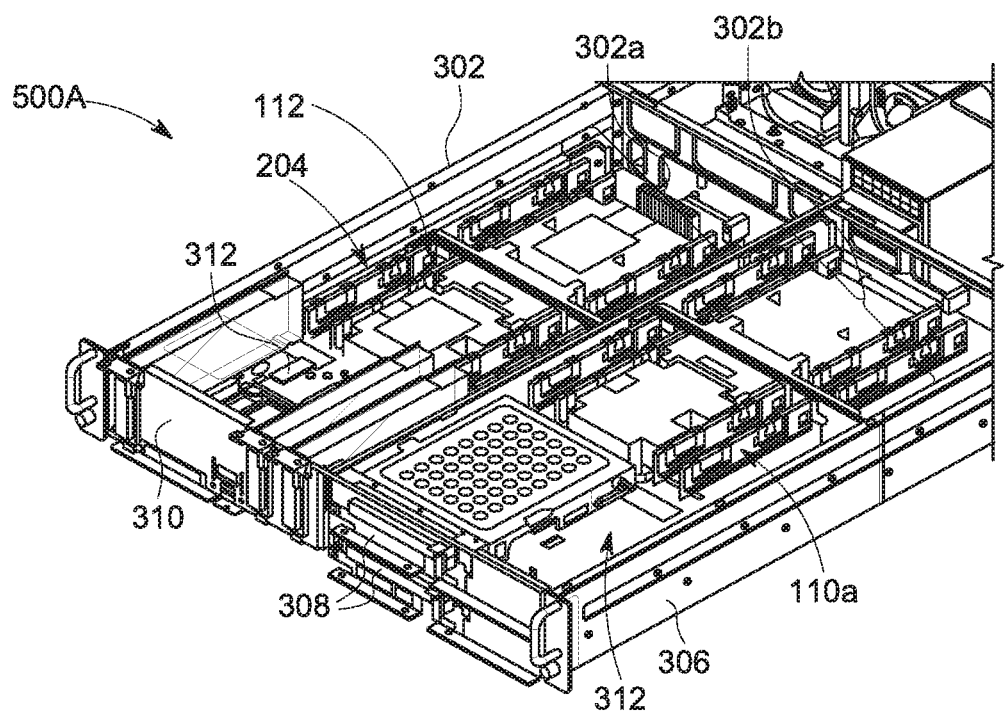
FIG. 5A shows an exemplary partitioned chassis in a loaded configuration.
Figure 5B:
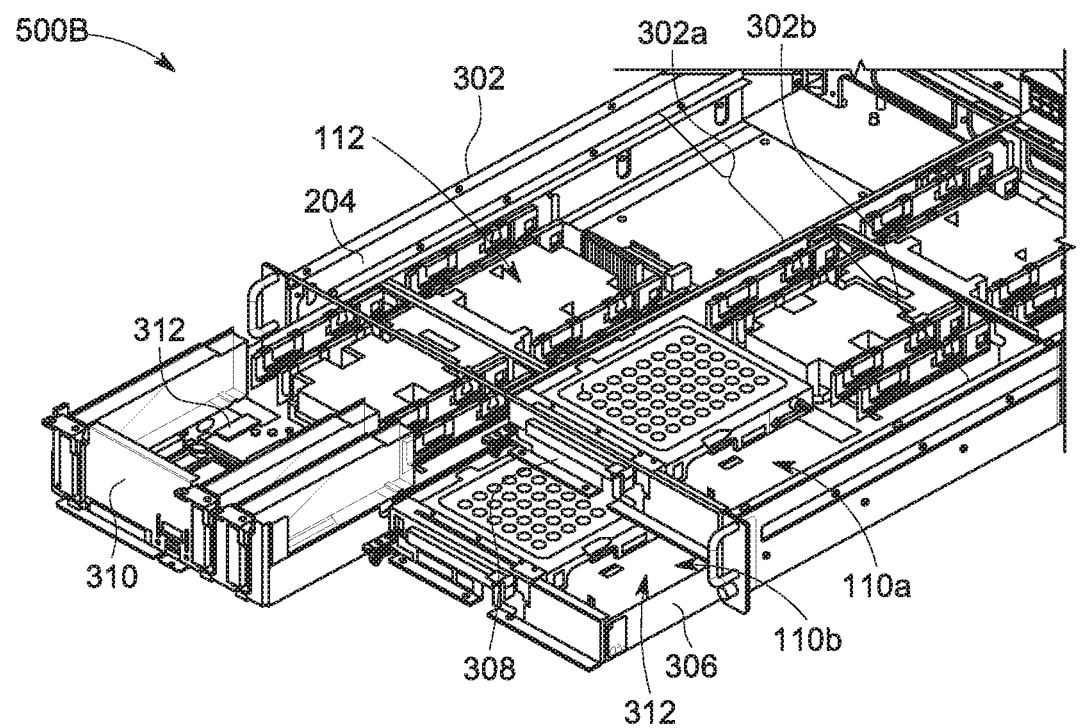
FIG. 5B shows an exemplary chassis in a partially loaded configuration, according to embodiments of the present disclosure.

FIG. 5A shows an exemplary partitioned chassis in a loaded configuration 500A, and FIG. 5B shows an exemplary chassis in a partially loaded configuration 500B, according embodiments of the present disclosure. FIGS. 5A-5B can include many components and similar labels to components in FIGS. 1-4C. FIGS. 5A-5B show how chassis 302 can hold a second size sled 112 in partition 302a and two first size sleds 110 in partition 302b. FIG. 5B shows how each sled 110a, 110b, and 112 can be pulled into and out of the chassis independently of each other. For example, sled 112 is pulled half way out of chassis 302; bottom sled 110 is pulled a small amount out of chassis 302; and top sled 110 remains in a loaded configuration.

Therefore, FIGS. 5A-5B show how a second size sled 112 can be replaced with two first size sleds 110 without having to replace the entire chassis 302 and remove any other existing sleds (e.g., the two sleds 110 in partition 302b) from the chassis 302.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A computer chassis, comprising: a chassis body comprising a bottom, at least two sides, and at least two pairs of rail brackets, wherein a first pair of rail brackets in the at least two pairs of rail brackets is on a first side of the chassis body, and a second pair of rail brackets in the at least two pairs of rail brackets is on a second side of the chassis body, the second side and the first side being on opposite sides of the chassis body, wherein the first pair of rail brackets and the second pair of rail brackets are at a set height from the bottom surface of the chassis body; and, wherein the computer chassis further comprises a set of sleds, said set of sleds being selected from the group consisting of three 1U sleds, one 1U sled and one 2U sled, and one 3U sled; at least one first size sled of the sleds comprises at least one rear bracket has a maximum height lower than a distance between a chassis base and the at least two pairs of rail brackets; at least one second size sled of the sleds comprises at least one rear bracket has opposing end portions with a height lower than a distance between a chassis base and the at least two pairs of rail brackets and a middle portion of the at least one rear bracket has a height larger than the set height; the chassis body comprises at least two partitions, wherein the at least two pairs of rail brackets are configured along sides of each partition; wherein the at least one second size sled is configured to have the middle portion occupies more than one partitions and the opposing end portions slide in the space between a chassis base and the at least two pairs of rail brackets.

2. The computer chassis of claim 1, wherein the chassis body comprises at least two partitions, wherein the at least two pairs of rail brackets are configured along sides of each partition.

3. The computer chassis of claim 1, wherein the set of sleds are selected from one 1 U sleds and one 2U sled.

4. The chassis assembly of claim 1, wherein the set of sleds is one 3U sled.

5. The computer chassis of claim 1, wherein each of the set of sleds is configured to move into and out of the chassis body independently.

6. A chassis assembly, comprising: a chassis body comprising at least two sides and at least two pairs of rail brackets, wherein a first pair of brackets in the at least two pairs of rail brackets is on a first side of the chassis body, and a pair of second brackets in the at least two pairs of rail brackets is on a second side of the chassis body, the second side and the first side being on opposite sides of the chassis body; and at least one set of sleds, wherein each of the at least one set of sleds holds at least one computer component, and wherein each of the at least one set of sleds has a size corresponding to the at least one computer component, and, wherein the at least one set of sleds is selected from the group consisting of three sleds of 1 U height, one sleds of 1 U height and one sled of 2U height, and one sled of 3 U height; at least one first size sled of the sleds comprises at least one rear bracket has a maximum height lower than a distance between a chassis base and the at least two pairs of rail brackets; at least one second size sled of the sleds comprises at least one rear bracket has opposing end portions with a height lower than a distance between a chassis base and the at least two pairs of rail brackets and a middle portion of the at least one rear bracket has a height larger than the set height; the chassis body comprises at least two partitions, wherein the at least two pairs of rail brackets are configured along sides of each partition; wherein the at least one second size sled is configured to have the middle portion occupies more than one partitions and the opposing end portions slide in the space between a chassis base and the at least two pairs of rail brackets.

7. The chassis assembly of claim 6, wherein the chassis body comprises more than one partition, wherein the at least two pairs of rail brackets are configured along sides of each partition.

8. The chassis assembly of claim 6, wherein the at least one sled is selected from one 1 U sleds and one 2 U sled.

9. The chassis assembly of claim 6, further comprising at least one rear bracket, wherein each of the at least one rear bracket is configured to couple with one of the at least one sled.

10. A rack system for housing a plurality of computer chassis, comprising: a plurality of chassis bodies, wherein each chassis body in the plurality of chassis bodies comprises at least two sides and at least two pairs of rail brackets, wherein a first pair of brackets in the at least two pairs of rail brackets is on a first side of each chassis body, and a second bracket in the at least two pairs of rail brackets is on a second side of each chassis body, wherein the first side and the second side are on opposing sides of each chassis body, and wherein each chassis body is configured to receive at least one sled; and a plurality of sleds, wherein each of the at least one sled holds at least one computer component, and wherein each of the plurality of sleds has a size corresponding to the at least one computer component and the at least one sled is selected from the group consisting of three 1 U sleds, one 1 U sleds and 1 2U sled, and one 3 U sled; at least one first size sled of the sleds comprises at least one rear bracket has a maximum height lower than a distance between a chassis base and the at least two pairs of rail brackets; at least one second size sled of the sleds comprises at least one rear bracket has opposing end portions with a height lower than a distance between a chassis base and the at least two pairs of rail brackets and a middle portion of the at least one rear bracket has a height larger than the set height; the chassis body comprises at least two partitions, wherein the at least two pairs of rail brackets are configured along sides of each partition; wherein the at least one second size sled is configured to have the middle portion occupies more than one partitions and the opposing end portions slide in the space between a chassis base and the at least two pairs of rail brackets.

11. The chassis assembly of claim 10, wherein at least one of the plurality of chassis bodies comprises more than one partition, wherein the at least two pairs of rail brackets are configured along sides of each partition.

12. The chassis assembly of claim 11, further comprising a plurality of rear brackets, wherein each of the plurality of rear brackets is configured to couple with one of the plurality of sleds.

* * * * *